(12) United States Patent
Cha

(10) Patent No.: US 7,508,018 B2
(45) Date of Patent: Mar. 24, 2009

(54) IMAGE SENSOR HAVING A HIGHLY DOPED AND SHALLOW PINNING LAYER

(75) Inventor: Han-Seob Cha, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 175 days.

(21) Appl. No.: 11/482,770

(22) Filed: Jul. 10, 2006

(65) Prior Publication Data

US 2007/0007562 A1 Jan. 11, 2007

(30) Foreign Application Priority Data

Jul. 11, 2005 (KR) ...................... 10-2005-0062301

(51) Int. Cl.
*H01L 31/062* (2006.01)
(52) U.S. Cl. ........................ 257/292; 257/209; 257/291; 257/293; 438/48

(58) Field of Classification Search ......... 257/290–293, 257/257–258, 461–462; 438/48, 59
See application file for complete search history.

(56) References Cited

U.S. PATENT DOCUMENTS 5,191,399 A * 3/1993 Maegawa et al. ............ 257/223
2003/0173585 A1 * 9/2003 Kimura et al. .............. 257/197

FOREIGN PATENT DOCUMENTS

KR 2001-93670 10/2001
KR 2002-30959 4/2002

* cited by examiner

*Primary Examiner*—Dung A. Le
(74) *Attorney, Agent, or Firm*—Morgan Lewis & Bockius LLP

(57) ABSTRACT

An image sensor includes a first conductivity type substrate with a trench formed in a predetermined portion thereof, a second conductivity type impurity region formed in the first conductivity type substrate below the trench and being a part of a photodiode, a second conductivity type first epitaxial layer filling the trench and being a part of the photodiode, and a first conductivity type second epitaxial layer formed over the second conductivity type first epitaxial layer.

12 Claims, 3 Drawing Sheets

IMAGE SENSOR HAVING A HIGHLY DOPED AND SHALLOW PINNING LAYER

FIELD OF THE INVENTION

The present invention relates to a method for fabricating a semiconductor device, and more particularly, to a method for fabricating an image sensor.

DESCRIPTION OF RELATED ARTS

An images sensor is a device which converts more than one- or two-dimensional optical information into electrical signals. Images sensors can be largely categorized into image orthicon and solid state imaging device. The image orthicon has been widely used in areas such as measurement, control and recognition, especially in TV, using image processing technology, and applied technologies related to the image orthicon have been developed. The solid state imaging device can be largely categorized into metal-oxide semiconductor (MOS) type and charge coupled device type.

On the other hand, the image sensor has used a pinned photodiode as an optical sensor. Herein, the pinned photodiode is used to maintain a dark current by nullifying a state of a silicon-silicon oxide layer interface using a shallow P-type doping region, i.e., pinning layer, disposed adjacent to the silicon-silicon oxide layer interface of a photodiode region.

FIG. 1 is a cross-sectional view illustrating a typical method for fabricating an image sensor. Device isolation structure 104 is formed in a substrate 103 to separate an active region and a device isolation region. The substrate 103 includes a P-epitaxial layer 102 formed over a $P^+$-type substrate 101.

A gate insulation layer 105 and a gate conductive layer 106 are sequentially formed over the device isolation structure 104 and the substrate 103. The gate insulation layer 105 and the gate conductive layer 106 are selectively etched to form a gate electrode 107.

A first impurity region 108 is formed by implanting N-type impurities where a photodiode is to be formed. The first impurity region 108 is formed to self-align with an edge of the gate electrode 107. Spacers 109 are formed on sidewalls of the gate electrode 107.

A barrier layer is formed over predetermined upper portions of the first impurity region 108 and the gate electrode 107, and then, highly doped P-type impurities are implanted into the substrate 103 to form a floating diffusion region 110.

A second impurity region 111 is formed as a pinning layer in the substrate 103 where the first impurity region 108 is formed, by implanting P-type impurities. The second impurity region 111 is formed to self-align with an edge of one individual spacer 109 formed on the sidewall of the gate electrode 107.

The second impurity region 111 is formed as the pinning layer of a pinned photodiode, and has been formed by employing an ion implantation and an annealing process. That is, an ion implantation process with extremely low energy is performed onto a substrate, and then, an annealing process for activating dopants implanted into the substrate is performed.

On the other hand, a P-type doping region, i.e., the pinning layer, is generally required to have a higher doping concentration level than an N-type doping region and to be formed extremely shallow from the surface of a silicon substrate. The pinning layer is generally required to have a high doping concentration level because photoproduction efficiency should be maximized by fully depleting the N-type doping region. Also, the pinning layer is generally required to be formed shallow to increase light sensitivity toward short wavelength, especially a range of wavelength for blue light, because short wavelength has a low transmissivity through silicon.

However, as image sensors have become highly integrated, it has become difficult to form the highly doped and shallow pinning layer through the typical technique of employing the ion implantation and the annealing process. Even if the ion implantation process is performed with low energy, a depth (thickness) of the pinning layer becomes larger due to a diffusion of the dopants during the annealing process because the pinning layer is highly doped. In a more highly integrated device, the depth of a pinning layer corresponding to the desired design rule cannot be obtained even when the minimum amount of ion implantation energy is used. Thus, there arise difficulties such as purchasing or developing additional apparatuses.

The ion implantation process inevitably generates defects on the surface of a substrate due to characteristics of the process. Thus, such defects function as a dangling bond on the surface of the substrate and generate noise.

SUMMARY OF THE INVENTION

It is, therefore, an object of the present invention to provide a photodiode having a highly integrated, highly doped, and shallow pinning layer, and a method for fabricating the same.

It is another object of the present invention to provide a photodiode with less noise by reducing a defect generation in a substrate of a photodiode region, and a method for fabricating the same.

It is still another object of the present invention to provide a photodiode having a high level of light absorption per unit surface area and high quantum efficiency, which changes the absorbed light into a photo-current, and a method for fabricating the same.

In accordance with an aspect of the present invention, there is provided an image sensor, including: a first conductivity type substrate with a trench formed in a predetermined portion thereof; a second conductivity type impurity region formed in the first conductivity type substrate below the trench and being a part of a photodiode; a second conductivity type first epitaxial layer filling the trench and being a part of the photodiode; and a first conductivity type second epitaxial layer formed over the second conductivity type first epitaxial layer.

In accordance with another aspect of the present invention, there is provided a method for fabricating an image sensor, including: preparing a first conductivity type substrate; forming a second conductivity type impurity region in a predetermined portion of the first conductivity type substrate; forming a mask pattern exposing the predetermined portion of the first conductivity type substrate over the first conductivity type substrate; etching the predetermined portion of the first conductivity type substrate using the mask pattern as an etch barrier to form a trench; forming a second conductivity type first epitaxial layer to fill the trench; and forming a first conductivity type second epitaxial layer over the second conductivity type first epitaxial layer.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

An image sensor and a method for fabricating the same in accordance with exemplary embodiments of the present invention will be described in detail with reference to the accompanying drawings.

Figure 1:
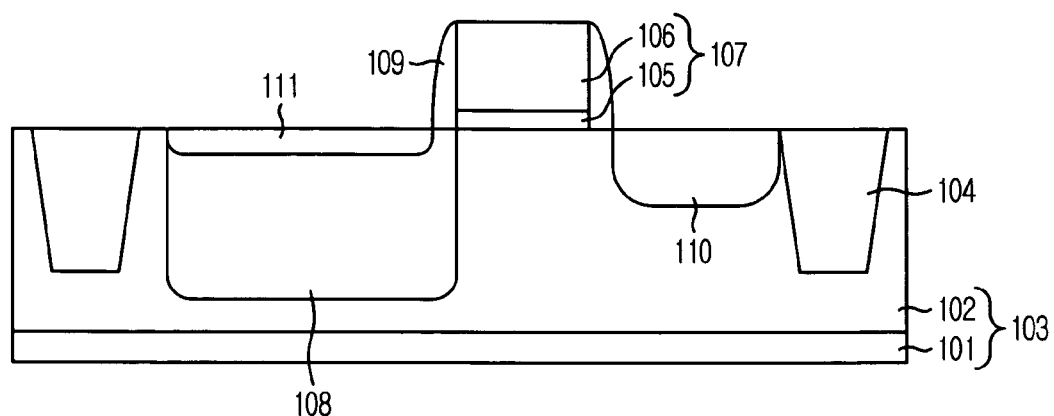
FIG. 1 is a cross-sectional view illustrating a typical method for fabricating an image sensor.
Figure 2:
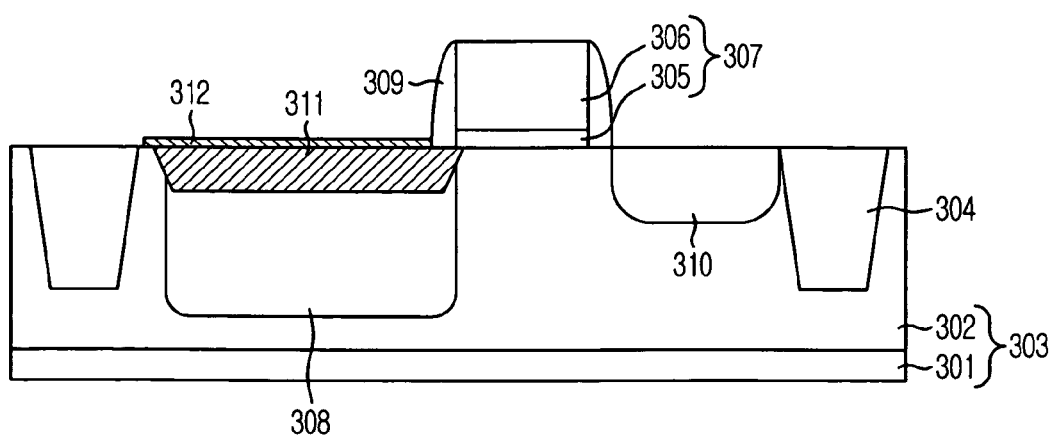
FIG. 2 is a cross-sectional view illustrating an image sensor in accordance with a specific embodiment of the present invention.

FIG. 2 is a cross-sectional view illustrating an image sensor in accordance with a specific embodiment of the present invention. Device isolation structure 304 is formed in a first conductivity type substrate 303 to define an active region and a device isolation region. The first conductivity type substrate 303 includes a P-type epitaxial layer 302 formed over a P$^+$-type substrate 301. Also, a gate structure 307 is formed over the active region of the first conductivity type substrate 303. The first conductivity type substrate 303 may include silicon.

The gate structure 307 includes a gate conductive layer 306 formed over a gate insulation layer 305. Spacers 309 are formed on both sidewalls of the gate structure 307.

Subsequently, an impurity region 308 doped with N-type impurities is formed in a predetermined portion of the first conductivity type substrate 303 where a photodiode is to be formed on one side of the gate structure 307. Then, a first epitaxial layer 311 doped with N-type impurities in-situ is formed over the impurity region 308. In more detail of the first epitaxial layer 311, a predetermined portion of the first conductivity type substrate 303 is etched to form a trench, and the first epitaxial layer 311 fills the trench thereafter.

The first epitaxial layer 311 may include one of silicon (Si) and silicon germanium (SiGe). In order to improve charge transfer efficiency, a portion of the first epitaxial layer 311 can be formed to overlap with a bottom portion of the gate structure 307. A depth of the trench ranges from approximately 1,800 Å to approximately 2,200 Å.

A second epitaxial layer 312 doped with P-type impurities in-situ is formed over the first epitaxial layer 311. The second epitaxial layer 312 is formed as a pinning layer including one of Si and SiGe, and a portion of the second epitaxial layer 312 contacts the first conductivity type substrate 303. A thickness of the second epitaxial layer 312 ranges from approximately 20 Å to approximately 1,000 Å. A floating diffusion region 310 is formed on the other side of the gate structure 307 in the first conductivity type substrate 303.

FIGS. 3A to 3D are cross-sectional views illustrating a method for fabricating an image sensor in accordance with a specific embodiment of the present invention.

Figure 3A:
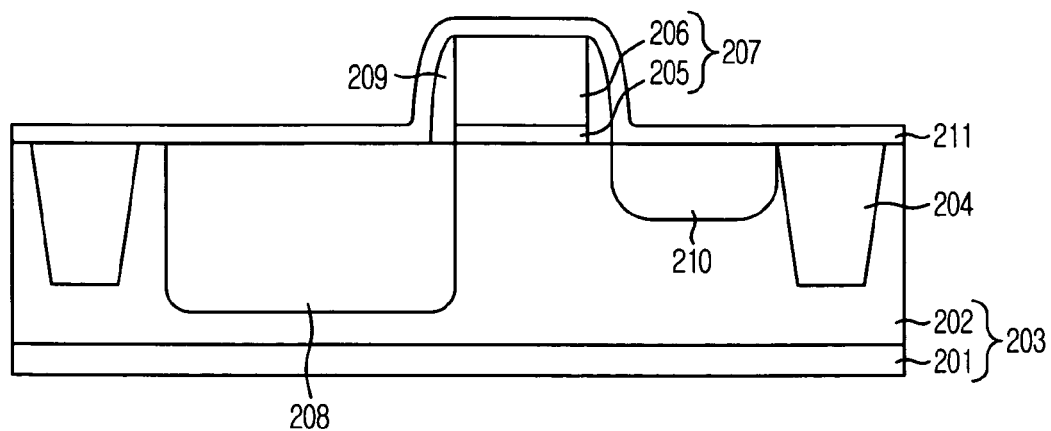
FIGS. 3A to 3D are cross-sectional views illustrating a method for fabricating an image sensor in accordance with the specific embodiment of the present invention.

As shown in FIG. 3A, a device isolation structure 204 is formed in a first conductivity type substrate 203 to define an active region and a device isolation region. The first conductivity type substrate 203 includes a P-type epitaxial layer 202 formed over a P$^+$-type substrate 201. The first conductivity type substrate 203 may include silicon.

One reason for using the lowly doped P-type epitaxial layer 202 formed over the highly doped P$^+$-type substrate 201 is because the existence of the lowly doped P-type epitaxial layer 202 allows a larger and deeper increase of a depletion region of a photodiode. Thus, the ability of the photodiode for concentrating photocharges can be increased. Another reason is because having the highly doped P$^+$-type substrate 201 below the P-type epitaxial layer 202 allows a fast reaggregation of photocharges before the photocharges diffuse into an adjacent unit pixel. Thus, random diffusion of the photocharges can be reduced, resulting in a reduced transfer function fluctuation of the photocharges.

Moreover, as the devices are becoming highly integrated, the device isolation structure 204 is formed by employing a shallow trench isolation (STI) process because the device isolation structure 204 generally does not have bird's beaks. In general, the STI process is capable of reducing regions that electrically isolate devices.

Subsequently, a gate insulation material layer and a gate conductive material layer are formed over the first conductivity type substrate 203 and the device isolation structure 204. Then, the gate insulation material layer and the gate conductive material layer are selectively etched to form a gate structure 207. The gate structure 207 includes a gate insulation layer 205 and a gate conductive layer 206.

Then, a second conductivity type impurity region 208 is formed by implanting N-type impurities into a predetermined region where the photodiode is to be formed, such that, the second conductivity type impurity region 208 is self-aligned with an edge of the gate structure 207.

Spacers 209 are formed on both sidewalls of the gate structure 207. The spacers 209 are formed by: sequentially forming a buffer oxide layer and a nitride layer over the resultant structure obtained after forming the second conductivity type impurity region 208; and performing a dry etching process on the buffer oxide and nitride layers.

Then, although not illustrated, a barrier layer is formed over the second conductivity type impurity region 208 and the gate structure 207, and then, highly concentrated P-type impurities are implanted into a portion of the first conductivity type substrate 203 not covered by the barrier layer to form a floating diffusion region 210. Then, the barrier layer is removed.

A mask layer 211 is formed over the substrate structure obtained after the removal of the barrier layer. The mask layer 211 may include an oxide-based layer formed by employing a chemical vapor deposition (CVD) method.

Figure 3B:
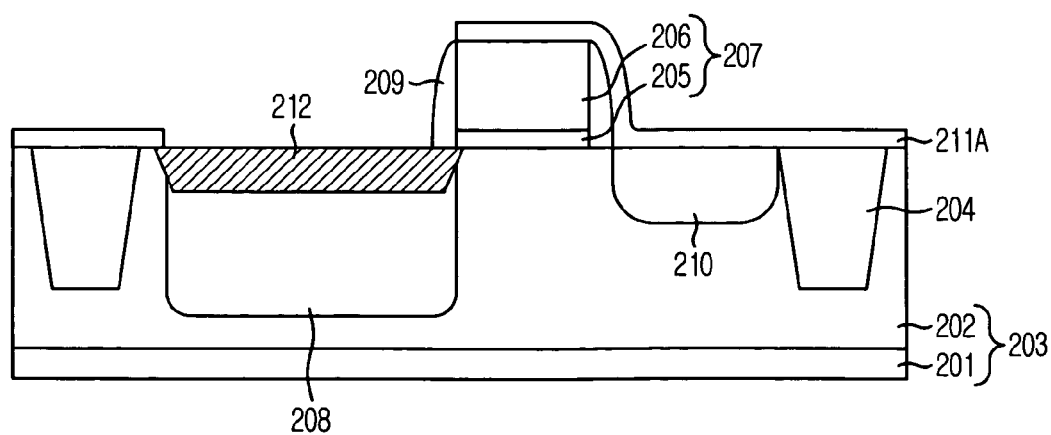

Referring to FIG. 3B, although not illustrated, a predetermined portion of the mask layer 211 is removed. The predetermined portion corresponds to a portion formed over a region where the photodiode is to be formed. Then, the first conductivity type substrate 203 is etched to form a trench using a patterned mask layer 211A. The patterned mask layer 211A is obtained by performing an etching process using hydrogen chloride (HCl). This etching process is performed at a temperature ranging from approximately 500° C. to approximately 5,000° C. with a pressure ranging from approximately 0.1 Torr to approximately 760 Torr. The second conductivity type impurity region 208 is formed below the trench. The trench has a thickness ranging from approximately 1,800 Å to approximately 2,200 Å.

A first epitaxial layer 212 fills the trench. The first epitaxial layer 212 has a second conductivity type. The first epitaxial layer 212 includes one of Si and SiGe. The first epitaxial layer 212 is generally formed to overlap with a bottom portion of the gate structure 207 to increase the charge transfer efficiency.

Specifically, the first epitaxial layer 212 is doped with N-type impurities (i.e., the second conductivity type impurities) while growing, using a doping gas including phosphine (PH$_3$). Meanwhile, if SiGe is used as the first epitaxial layer 212, a Ge source of germane (GeH$_4$) at a Ge concentration level of approximately 5% to approximately 100% is used.

Figure 3C:
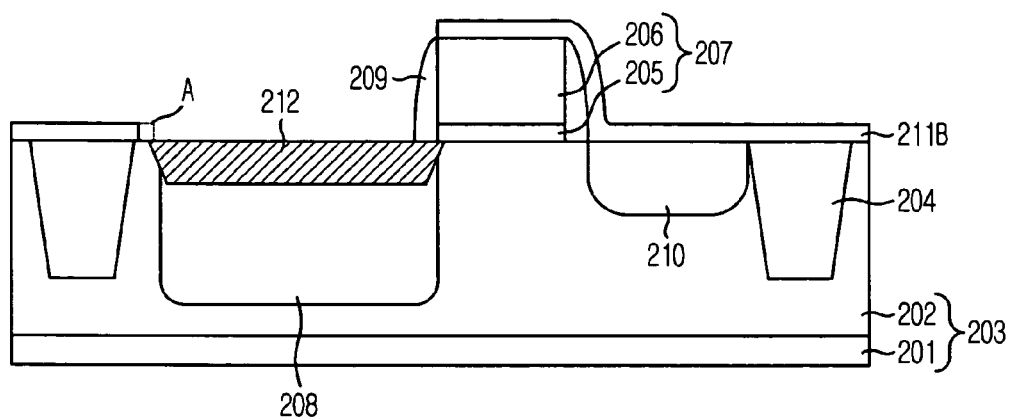

Referring to FIG. 3C, a predetermined portion 'A' of the patterned mask layer 211A is selectively etched to form a mask pattern 211B. The mask pattern 211B is used to form a second epitaxial layer having a larger width than the first epitaxial layer 212.

Figure 3D:
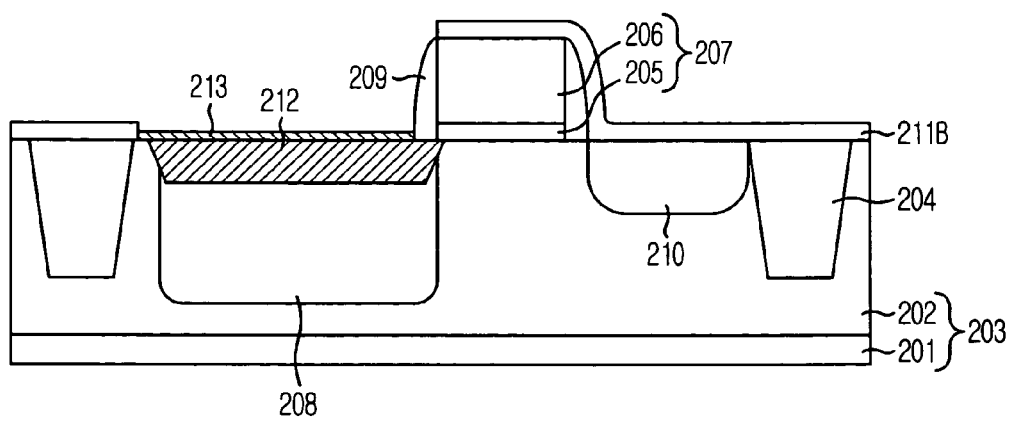

As shown in FIG. 3D, a second epitaxial layer 213 is grown over the first epitaxial layer 212. The second epitaxial layer 213 has a first conductivity type.

The second epitaxial layer 213 functions as a pinning layer, and includes one of Si and SiGe. The second epitaxial layer 213 is doped with P-type impurities (i.e., the first conductivity type impurities) in-situ while growing.

The second epitaxial layer 213 is doped with the P-type impurities using a doping gas including diborane (B$_2$H$_6$) at a concentration level ranging from approximately $1 \times 10^{17}$ cm$^{-3}$ to approximately $1 \times 10^{22}$ cm$^{-3}$.

In accordance with the specific embodiment of the present invention, the P-type impurity region having a small thickness with a uniform doping level can be formed by forming the second epitaxial layer with Si or SiGe doped in-situ, where the second epitaxial layer is the P-type impurity region formed over the photodiode including a P/N/P junction.

Such P-type impurity region having the small thickness with the uniform doping level can secure carriers generated in the short wavelength region for the visible light (e.g. blue light), and thus, increases the sensor sensitivity.

Furthermore, an improved photodiode having an improved light absorption per unit surface area when compared to the typical photodiode and high quantum efficiency for transferring the absorbed light into a photo-current can be formed by forming the first epitaxial layer with Si or SiGe doped in-situ, where the first epitaxial layer is part of the N-type impurity region in the P/N/P junction.

Especially, by altering the photoelectric transformation efficiency of the blue light wavelength region, an additional alteration of the layout is not required, and thus, an easier embodiment can be achieved.

Furthermore, a dangling bond generated by the ion implantation process can be prevented, and thus a noise can be removed by: forming the first epitaxial layer to partially contact the bottom portion of the gate electrode, improving the charge transfer efficiency; and doping the first and the second epitaxial layers in-situ while growing.

The present application contains subject matter related to the Korean patent application No. KR 2005-62301, filed in the Korean Patent Office on Jul. 11, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An image sensor, comprising:
   a first conductivity type substrate with a trench formed in a predetermined portion thereof;
   a second conductivity type impurity region formed in the first conductivity type substrate below the trench and being a part of a photodiode;
   a second conductivity type first epitaxial layer filling the trench and being a part of the photodiode; and
   a first conductivity type second epitaxial layer formed over the second conductivity type first epitaxial layer.

2. The image sensor of claim 1, further comprising a gate structure formed over the first conductivity type substrate next to the photodiode.

3. The image sensor of claim 1, wherein the first conductivity type second epitaxial layer is a pinning layer.

4. The image sensor of claim 1, wherein the second conductivity type first epitaxial layer includes one of silicon (Si) and silicon germanium (SiGe).

5. The image sensor of claim 1, wherein the first conductivity type second epitaxial layer includes one of silicon (Si) and silicon germanium (SiGe).

6. The image sensor of claim 1, wherein the second conductivity type first epitaxial layer overlaps with a bottom portion of the gate structure.

7. The image sensor of claim 1, wherein the first conductivity type second epitaxial layer contacts the first conductivity type substrate.

8. The image sensor of claim 1, wherein the trench has a depth ranging from approximately 1,800 .ANG. to approximately 2,200 .ANG.

9. The image sensor of claim 1, wherein the second conductivity type first epitaxial layer is doped with second conductivity type impurities in-situ while growing.

10. The image sensor of claim 1, wherein the first conductivity type second epitaxial layer is doped with first conductivity type impurities in-situ while growing.

11. The image sensor of claim 1, wherein the first conductivity type second epitaxial layer has a thickness ranging from approximately 20 .ANG. to approximately 1,000 .ANG.

12. The image sensor of claim 1, wherein the first conductivity type substrate includes Si.

* * * * *